United States Patent
Von Kluge

(10) Patent No.: US 8,115,277 B2
(45) Date of Patent: Feb. 14, 2012

(54) INTEGRATED CIRCUIT HAVING A MATERIAL STRUCTURED BY A PROJECTION

(75) Inventor: Johannes Von Kluge, Dresden (DE)

(73) Assignee: Qimonda AG, Munich (DE)

(*) Notice: Subject to any disclaimer, the term of this patent is extended or adjusted under 35 U.S.C. 154(b) by 0 days.

(21) Appl. No.: 12/975,891

(22) Filed: Dec. 22, 2010

(65) Prior Publication Data

US 2011/0090616 A1   Apr. 21, 2011

Related U.S. Application Data

(62) Division of application No. 12/121,331, filed on May 15, 2008, now Pat. No. 7,888,230.

(30) Foreign Application Priority Data

May 15, 2007   (DE) .......................... 10 2007 022 748

(51) Int. Cl.
   *H01L 29/00*        (2006.01)

(52) U.S. Cl. ................ 257/532; 257/E29.343; 438/396; 361/301.4

(58) Field of Classification Search ............... 361/301.4; 430/311; 438/396, 464, 458; 257/532, E29.343, 257/E21.008
See application file for complete search history.

(56) References Cited

U.S. PATENT DOCUMENTS

| | | | |
|---|---|---|---|
| 6,258,691 B1 | 7/2001 | Kim | |
| 6,534,221 B2 | 3/2003 | Lee et al. | |
| 6,887,650 B2 * | 5/2005 | Shimoda et al. | 430/311 |
| 6,946,341 B2 | 9/2005 | Joo et al. | |
| 7,027,227 B2 | 4/2006 | Chiba et al. | |
| 7,067,385 B2 | 6/2006 | Manning | |
| 7,125,781 B2 | 10/2006 | Manning et al. | |
| 7,541,257 B2 * | 6/2009 | Ishikawa et al. | 438/407 |
| 7,557,015 B2 | 7/2009 | Sandhu et al. | |
| 2002/0086479 A1 | 7/2002 | Reinberg | |
| 2004/0043139 A1 * | 3/2004 | Daniels | 427/66 |
| 2005/0245022 A1 | 11/2005 | Gutsche et al. | |
| 2005/0253179 A1 | 11/2005 | Park | |
| 2006/0252224 A1 | 11/2006 | Basceri et al. | |
| 2006/0263968 A1 | 11/2006 | Manning | |
| 2007/0037349 A1 | 2/2007 | Gutsche et al. | |
| 2008/0090039 A1 * | 4/2008 | Klein et al. | 428/35.7 |

OTHER PUBLICATIONS

Kim et al., "A Mechanically Enhanced Storage node for virtually unlimited Height (MESH) Capacitor Aiming at sub 70nm DRAMs", IEDM Tech. Dig., p. 69-72 (2004).

* cited by examiner

*Primary Examiner* — Phuc Dang
(74) *Attorney, Agent, or Firm* — Dicke, Billig & Czaja, PLLC

(57) ABSTRACT

A method of making an integrated circuit including structuring a material. The method includes providing an arrangement of three-dimensional bodies. The material is arranged between the bodies and structured directed radiation. The projection pattern of the three-dimensional bodies is transferred into the material. The structured material connects at least two of the three-dimensional bodies.

20 Claims, 4 Drawing Sheets

INTEGRATED CIRCUIT HAVING A MATERIAL STRUCTURED BY A PROJECTION

CROSS-REFERENCE TO RELATED APPLICATIONS

This Utility patent application is a divisional application of U.S. application Ser. No. 12/121,331, filed May 15, 2008, U.S. Pat. No. 7,888,230, and claims priority to German Application No. 10 2007 022 748.7-43 filed May 15, 2007, which are incorporated herein by reference.

BACKGROUND

The following description relates to the technical field of semiconductor components, specifically it refers to a method of structuring a layer in a semiconductor component.

In the following context the term "semiconductor component" relates in general to integrated circuits, chips, as well as single semiconductor components like for example analog or digital circuits or single semiconductor components like semiconductor memory elements, for example, functional storage components (PLAs, PALs etc.) and array storage elements (ROMs or RAMs, especially SRAMs and DRAMs).

Beside other applications, for example, micromechanical components, the method of structuring can be used to manufacture stabilizing support structures of capacitors of DRAM-components. According to the cell concept one may distinguish between trench capacitors and stack capacitors. Trench capacitors are formed in the substrate and therefore are arranged underneath the selection transistors of the respective cell. On the other hand, stack capacitors are arranged above the substrate and above the selection transistors.

In terms of shape, both capacitor types may have a cylindrical form. The cross section may be round or elliptical and does not need to be of the same shape over the axial course of the capacitor. For sake of simplicity, the shape is referred to as tube, whereas different areas and sizes of cross sections at different axial positions are possible. Furthermore the tubes may include an overhang, i.e. they may have a larger cross section in a top portion compared to a lower portion.

To increase the capacitance of a capacitor C $$C = \varepsilon_o \varepsilon_r \frac{A}{d}$$

with the surface A, the distance between the electrodes d and the dielectric constant $\varepsilon_r$, various measures are applied. One measure may be the increase of the aspect ratio of the capacitor tube and thereby the increase of the capacitor surface A.

The structure of the stack capacitors above the substrate leads to the problem of mechanical stability of the capacitor arrangement. For example, a process using liquids (e.g., a wet etch or a wet rinse) may lead to a collapse of the tubes due to capillary forces.

Various techniques are applied for the mechanical stabilization of the stack capacitor.

In general, support structures are introduced which are arranged in an upper portion of the capacitor tube and which connect adjacent tubes with each other. This may prevent a bending of the capacitor tubes. However, it must be ensured that the material underneath the support structure can be at least partly removed. To achieve this, a structuring of the support material needs to be done in order to create openings.

One possibility to structure the support material is the use of the so called mask process. In a first step, a photoresist is deposited. The resist is exposed through a mask and the exposed or unexposed parts of the resist are removed. The structure of the resist layer is transferred in a subsequent step into the support material. Disadvantage of such a method is the need of a mask for this process and additional steps like the deposition of the photoresist, the exposure and the structuring of the resist, etc. are required. This impacts the cost of such a manufacturing process of a semiconductor component.

Kim et al., "A Mechanically Enhanced Storage Node for Virtually unlimited Height (MESH) Capacitor Aiming at sub 70 nm DRAMs", IEDM Tech. Dig., p. 69-72 (2004) illustrates a support structure of a stack capacitor made from silicon nitride. The structuring of the support structure is performed by using the so called spacer technology. A conformal silicon nitride layer is deposited onto the capacitor tube. The support material is subsequently structured by using dry etch step. Using this method, the structuring is self aligned and no mask step is required.

A similar process is proposed by Manning in U.S. Pat. No. 7,067,385. A spacer is used for the structuring of the support material as well.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
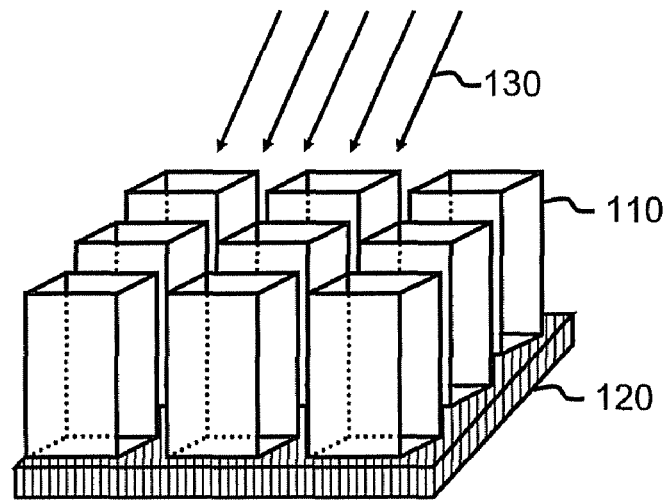
FIG. 1 illustrates a schematic representation of a perspective view of an arrangement of three-dimensional bodies with material between the three-dimensional bodies and a directed radiation.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As described in complete detail below, one embodiment of a method of making an integrated circuit or device including a the method for structuring a material includes:

providing an arrangement of three-dimensional bodies with the material between the bodies;

structuring the material by directed radiation, whereby the projection pattern of the three-dimensional bodies is transferred into the material and the material connects at least two of the three-dimensional bodies.

The term "connecting" does not only refer to the direct mechanical contact between the three-dimensional bodies, but may in a wider meaning also refer to three-dimensional bodies being coupled. In this case, a further material may be arranged between three-dimensional bodies in addition to the structured material. It is also be possible, that a gap exist between the three-dimensional bodies and the structured material.

The directed radiation may, for example, include radiation with ions, electrons or photons. When using ions, the ions may substantially have one direction and may be selected from the group of $BF_2$, B, P, As, Ge, $N_2$, N, C, Si, F, In, Sb, He, Ne, Ar, Kr, Xe, or Rn.

The three-dimensional bodies may be formed as tubes. The tubes may include a round or elliptical cross section and may include an overhang.

The material between the three-dimensional bodies may, for example, be selected from the group of silicon oxide, amorphous silicon, silicon nitride or a photoresist.

The material being exposed or being not exposed by the directed radiation and arranged between the three-dimensional bodies may be removed in a separate process step.

In one embodiment, the material between the three-dimensional bodies may have a higher removal rate after the directed radiation compared to the removal rate before the radiation.

In one embodiment, the material between the three-dimensional bodies may also have a lower removal rate after the directed radiation compared to the rate before the radiation.

The material between the three-dimensional bodies can be removed in a separate process using a liquid which may be selected from the group of ammonia, hydrofluoric acid or a solvent to develop a photoresist.

The material between the three-dimensional bodies may be removed by using a plasma in a separate process.

The material between the three-dimensional bodies may be eroded by the directed radiation.

The arrangement of three-dimensional bodies may be an arrangement of stack capacitors and the material between the three-dimensional bodies may be a support structure between the stack capacitors. The material between the three-dimensional bodies can as well be used to structure a second material; the second material then forming the support structure between these stack capacitors.

One embodiment provides a material which is structured by a projection of an arrangement of three-dimensional bodies by directed radiation wherein the projection pattern of the three-dimensional bodies is transferred into the material and the material connects at least two of the three-dimensional bodies.

One embodiment provides an arrangement of stack capacitors with a material being structured by projection of an arrangement of stack capacitors by directed radiation, wherein a projection pattern of the stack capacitors is transferred into the material and the material connects at least two of the stack capacitors. The material between the stack capacitors may as well be used to structure a second material.

One embodiment provides an integrated circuit, which includes a material, the material being structured by the inventive method. The integrated circuit may at least include two stack capacitors and a stack capacitor and a material which has been structured by the inventive method.

One embodiment provides a DRAM component including stack capacitors which are connected by a material which has been structured by the inventive method.

The invention is described in detail in the following with reference to the drawings. The drawings illustrate embodiments of the invention. However, the invention can be realized in various implementations and it is not intended to limit the invention to the implementations illustrated. Moreover, the implementations serve to formulate the disclosure in a diligent and accurate manner and to enable the persons skilled in the art to exercise the invention. The drawings are not to scale, but shall illustrate the necessary elements for understanding the invention in a schematic way. The layer thicknesses are not to scale, as well as the diameters and heights of the three-dimensional bodies or tubes, and therefore as well their aspect ratio. The angle of the radiation is arbitrary and is illustrated to demonstrate the inventive principle.

Figure 2:
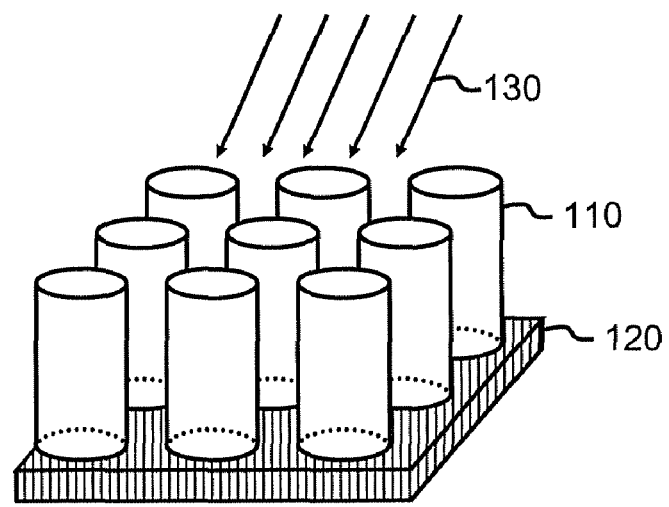
FIG. 2 illustrates a schematic representation of a perspective view of an arrangement of tubes with a material between the tubes and directed radiation.

FIGS. 1 and 2 illustrate a general arrangement to represent the inventive concept. An arrangement of three-dimensional bodies 110 with a material 120 in between is subjected to directed radiation 130. It is intended to structure the material 120 between the tubes 110 by using the inventive concept.

The inventive concept is discussed in more details in FIG. 2 according to one embodiment using tubes as three-dimensional bodies 110 and using directed radiation 130 by ions, electrons or photons.

A projection pattern 103 is generated on the material 120 by the arrangement of tubes 110 subjected to the directed radiation 130. The projection pattern depends on the angle of incidence of the directed radiation 130 and the structure and arrangement of the tubes 110.

Figure 3:
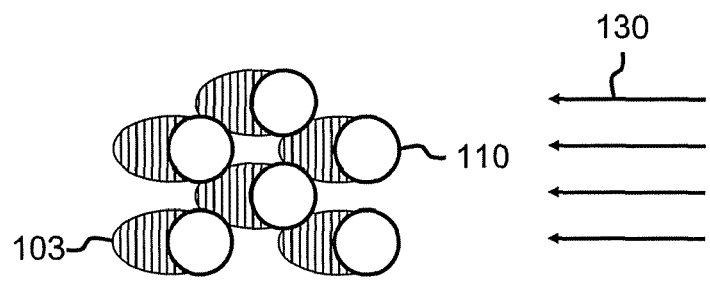
FIG. 3 illustrates a top view of an arrangement of tubes with a projection pattern after a directed radiation from a first direction.

FIG. 3 illustrates an example of a top view of the arrangement of tubes 110 with a projection pattern 103 after directed radiation 130 from a first direction. The projection pattern of the tubes 110 is transferred into the material 120.

In one embodiment, the removal rate of the material 120 is modified by the radiation 130. On the one hand, it is possible that the material 120 has an increased removal rate after radiation 130 compared to the same material 120 without radiation 130. In a subsequent process, this selectivity of the removal rate is used to remove the material 120 being irradiated by the ions 130. The remaining structure 103 of the material 120 shall be structured so as to generate a connection between at least two of the tubes 110 by the material 120.

The term "connect" is not limited in this case to direct contact between the three-dimensional bodies 110 but may also mean that the three-dimensional bodies 110 are coupled with each other. In this case, a further material can be arranged between the three-dimensional bodies 110 in addition to the structural material 120. It is as well possible, that a gap between the three-dimensional bodies 110 exist in addition to the structured material 120.

The term "removal rate" is intended to have a general meaning The exposed or non exposed material 120 can be removed for example chemically, mechanically, by use of a solvent or a developer.

In one embodiment, the removal rate of the material 120 is modified by the radiation 130. It is as well possible that the material 120 may have a lower removal rate after radiation 130 compared to the same material 120 without radiation 130. In a further step, this selectivity of the removal rate is used to remove the material 120 not irradiated by the ions 130. The remaining structure 103 of the material 120 shall be structured so as to form a connection between at least two tubes 110 by the material 120.

In one embodiment, a liquid may be used to remove the material 120 irradiated by ions 130.

In one embodiment, a "dry etching step" using a plasma can be used to remove the irradiated or non-irradiated material 120. In this case, the removal through an isotropic etch component can be done by radicals generated in a plasma. It is as well possible to use a removal by an anisotropic etch component from accelerated ions of a plasma boundary layer. A combination of isotropic and anisotropic components may be used to remove the irradiated or the non-irradiated material 120 by using a plasma.

In one embodiment, the material 120 is eroded directly through the radiation 130. Ions may be used for the radiation 130. The material 120 irradiated by the ions 130 will thereby be removed. The remaining structure 103 of the material 120 shall be formed so as to connect at least two tubes 110 by the material 120.

Figure 4:
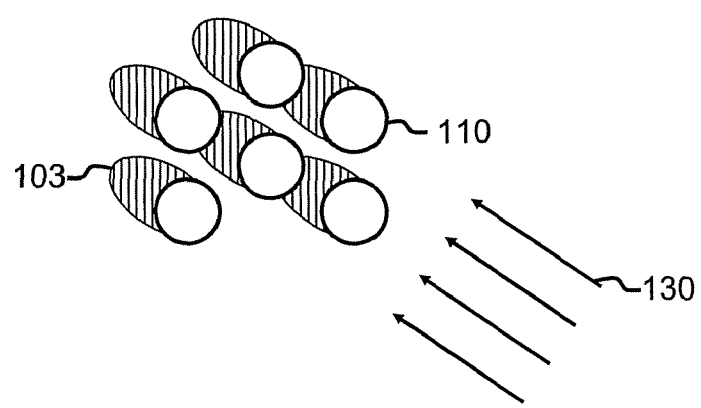
FIG. 4 illustrates the same top view as FIG. 3 after a directed radiation from a second direction.

FIG. 4 illustrates, for example, a top view of an arrangement of tubes 110 with a projection pattern 103 after radiation 130 from a second direction. The projection pattern 103 of the tubes 110 is transferred into the material 120.

Figure 5:
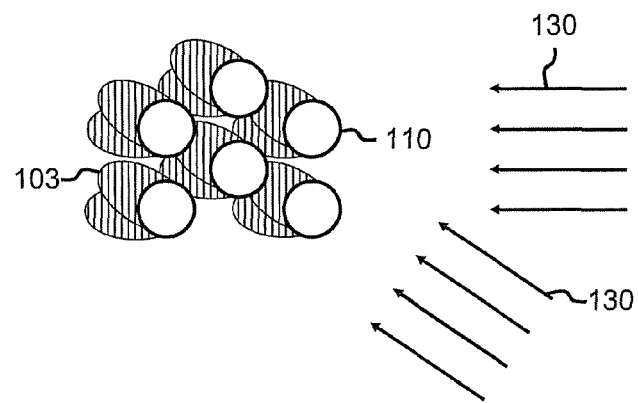
FIG. 5 illustrates a top view of an arrangement of tubes with a projection pattern after directed radiation from two different directions.

FIG. 5 illustrates, for example, a top view of an arrangement of tubes 110 with a projection pattern 103 after radiation 130, wherein the radiation 130 is performed from two different directions. The radiation 130 can be performed in parallel from two different directions or sequentially using two subsequent processes.

The combination of different angles of incidence of the ions and different directions may not be limited. They may be selected to provide a projection pattern 103 which is optimized for the underlying application in order to form a connection between at least two tubes by the material 120.

Figure 6A:
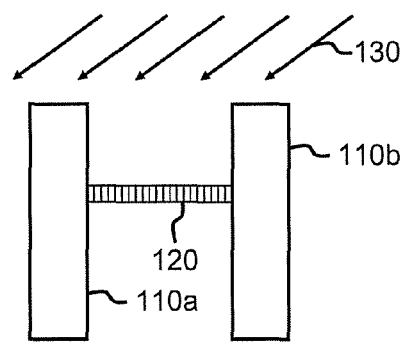
FIG. 6A illustrates a side view of two adjacent tubes and with a material between these two tubes prior to a directed radiation.
Figure 6B:
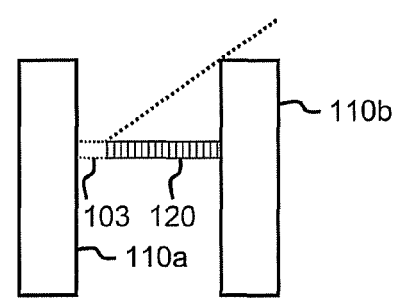
FIG. 6B illustrates a side view of two adjacent tubes and with material between these two tubes after removing the material exposed during the radiation.

FIGS. 6A and 6B illustrate a side view of two adjacent tubes 110a and 110b with a material 120 arranged between this two tubes prior to a radiation 130, and after removal of the material exposed to the radiation, respectively. The directed ions 130 are blocked by the right tube 110b thereby forming two areas of different exposure in the material 120. The area 103 of the material 120 is irradiated by the ions 130, while the remaining material 120 is not.

Figure 7A:
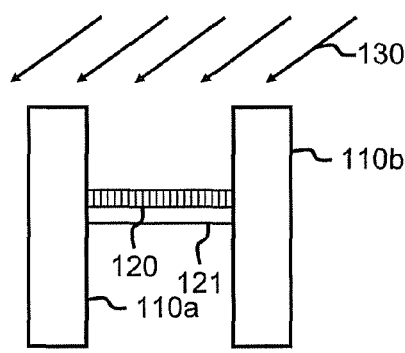
FIG. 7A illustrates a further implementation with a first material and a second material arranged between two adjacent tubes and prior to a directed radiation.
Figure 7B:
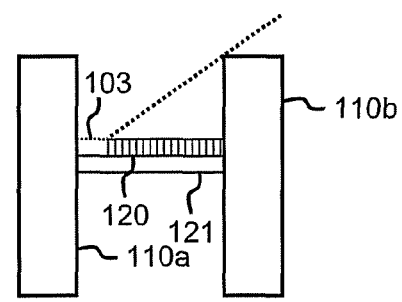
FIG. 7B illustrates a further implementation with a first material and second material arranged between two adjacent tubes and after removal of the material exposed during the radiation.

FIGS. 7A and 7B illustrate a similar side view compared to FIGS. 6A and 6B of two adjacent tubes 110a and 110b with a first material 120 arranged between these two tubes and a second material 121 underneath the first material 120. The first material 120 is structured using the inventive concept, and may be used as a hard mask for structuring the second material 121.

The shape of the tubes 110 can have a constant cross section along the axial course or may vary over it. The tubes 110 may have a larger cross section in a portion above the material 120 compared to a portion located directly at the material 120, i.e. they may form an overhang above the material 120. The method is suitable for the projection of three-dimensional bodies 110 having an arbitrary shape.

The inventive structuring method can be used to manufacture support structures of capacitors of DRAM components. These capacitors may be so called "stack capacitors" which require a support structure for mechanical stabilization.

The material 120 forms in this case the support structure. The tubes 110 form, at least partially, the stack capacitors. The tubes 110 may in this case form the first electrode of the stack capacitors. The first electrode is formed in a fill material, also called mould material. In an upper portion of the first electrode, a layer or a system of layers is deposited, which later forms the support structure.

In order to be able to remove the mould material at least partially in a subsequent step, the layer or the system of layers of the support structure needs to be structured. It may in this case be advantageous to provide openings of maximum width in order to be able to remove the underlying mould material in the easiest possible way. With the help of the inventive method the structuring of the support structure of stack capacitors may be performed in an advantageous way.

The stack capacitors may be present in various different two-dimensional arrangements. One arrangement may be a hexagonal pattern. It is possible, that this pattern is not a purely periodic arrangement, but the pattern may include periodic and non-periodic regions as well.

The material 120 may be selected from the group silicon oxide, amorphous silicon, silicon nitride or a photoresist. Silicon nitride may have advantages when forming stack capacitors.

The ions may be selected from the group of BF2, B, P, As, Ge, N2, N, C, Si, F, In, Sb, He, Ne, Ar, Kr, Xe or Rn. From this group the elements He, Ne, Ar, Kr, Xe or Rn may be advantageously used in the case of a direct erosion of the material 120. For example, Ar may be used due to its inert properties and the mass adaption for mechanical removal, so called "sputtering". In one implementation, a liquid selected from the group of ammonia, hydrofluoric acid, or a developer of photoresist may be used in the selective removal of the material 120.

Figure 8:
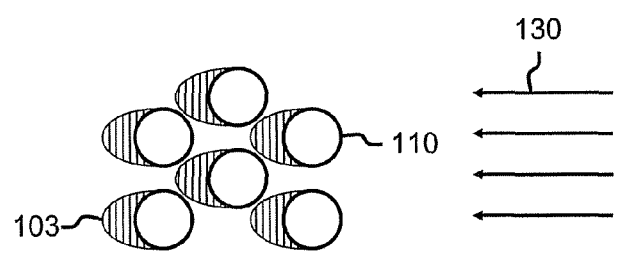
FIG. 8 illustrates a top view of an arrangement of tubes with a projection pattern after directed radiation from a first direction.

FIG. 8 illustrates, for example, a top view of an arrangement of tubes 110 with a projection pattern 103 after directed radiation 130 from one direction. The projection pattern 103 of the tubes 110 are transferred into the material 120. In this case, the projection pattern 103 is only connected directly with one of the tubes 110 and the tubes 110 are coupling with each other through a gap. This gap may be filled with a material. In the case that the gap is not filled, the tubes 110 are allowed to move sideways, but are limited in sideway movement by the material 120.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A material structured by a projection of an arrangement of three-dimensional bodies using directed radiation, wherein a projection pattern of the three-dimensional bodies is transferred into the material and the structured material connects at least two of the three-dimensional bodies.

2. An arrangement comprising:
stack capacitors with a material being structured by a projection of an arrangement of the stack capacitors using directed radiation, wherein a projection pattern of the stack capacitors is transferred into the material and the structured material connects at least two of the stack capacitors.

3. An arrangement comprising:
stack capacitors with a second material being structured by a first material, the first material being structured by a projection of an arrangement of the stack capacitors using directed radiation, wherein a projection pattern of the stack capacitors is transferred into the first material and the structured material connects at least two of the stack capacitors.

4. The structured material of claim 1, wherein the structured material connects at least two of the three-dimensional bodies by contacting sidewalls of the at least two three-dimensional bodies.

5. The structured material of claim 1, wherein the three-dimensional bodies comprise tubes.

6. The structured material of claim 5, wherein the tubes comprise a round or an elliptical cross-section.

7. The structured material of claim 5, wherein the tubes comprise an overhang.

8. The structured material of claim 1, wherein the material comprises silicon oxide.

9. The structured material of claim 1, wherein the material comprises amorphous silicon.

10. The structured material of claim 1, wherein the material comprises silicon nitride.

11. The structured material of claim 1, wherein the material comprises a photoresist.

12. The arrangement of claim 2, wherein the structured material connects at least two of the stack capacitors by contacting sidewalls of the at least two stack capacitors.

13. The arrangement of claim 2, wherein the material comprises one of silicon oxide, amorphous silicon, silicon nitride, and a photoresist.

14. The arrangement of claim 2, wherein the stack capacitors comprise tubes.

15. The arrangement of claim 14, wherein the tubes comprise a round or an elliptical cross-section.

16. The arrangement of claim 14, wherein the tubes comprise an overhang.

17. The arrangement of claim 3, wherein the structured material connects at least two of the stack capacitors by contacting sidewalls of the at least two stack capacitors.

18. The arrangement of claim 3, wherein the first material comprises one of silicon oxide, amorphous silicon, silicon nitride, and a photoresist.

19. The arrangement of claim 3, wherein the stack capacitors comprise tubes.

20. The arrangement of claim 19, wherein the tubes comprise a round or an elliptical cross-section.

* * * * *